United States Patent [19]
Ke et al.

[11] Patent Number: 5,659,552
[45] Date of Patent: Aug. 19, 1997

[54] METHOD AND APPARATUS FOR VERIFYING TEST INFORMATION ON A BACKPLANE TEST BUS

[75] Inventors: Wuudiann Ke, Lawrenceville, N.J.; Duy K. Le, Levittown, Pa.

[73] Assignee: Lucent Technologies Inc., Murray Hill, N.J.

[21] Appl. No.: 544,351

[22] Filed: Oct. 17, 1995

[51] Int. Cl.⁶ .................................................. G01R 31/28
[52] U.S. Cl. ................................ 371/22.32; 324/158.1
[58] Field of Search ................................ 371/22.3, 25.1, 371/27, 20.4, 20.5, 20.6, 32, 34, 35, 49.1, 53, 55, 67.1, 68.2; 324/158.1, 73.1

[56] References Cited

U.S. PATENT DOCUMENTS

| | | | |
|---|---|---|---|
| 4,694,453 | 9/1987 | Kobayashi et al. | 370/85.7 |
| 4,729,124 | 3/1988 | Hansel et al. | 395/183.07 |
| 5,068,854 | 11/1991 | Chandran et al. | 371/37.1 |
| 5,132,635 | 7/1992 | Kenedy | 324/158 R |

OTHER PUBLICATIONS

IEEE Std. 1149.1-1990, "IEEE Standard Test Access Port and Boundary-Scan Architecture," Chapter 5, pp. 5-1-5-17.

*Primary Examiner*—Hoa T. Nguyen
*Attorney, Agent, or Firm*—Robert B. Levy

[57] ABSTRACT

Verification of test information transmitted across an 1149.1 backplane test bus between a circuit board ($12_1$) and a test master (14) is accomplished by having both the test master and the circuit board compute a check code for each block of information that is transmitted by, or received at, the board. During intervals other than one of the active Boundary-Scan states, the test master (14) acquires the check codes produced at the circuit board ($12_1$) and compares them to the corresponding codes generated by the tests master. Any difference between the corresponding codes generated by the test master and the circuit board signifies a transmission error.

12 Claims, 3 Drawing Sheets

METHOD AND APPARATUS FOR VERIFYING TEST INFORMATION ON A BACKPLANE TEST BUS

TECHNICAL FIELD

This invention describes a technique for verifying the integrity of test information transmitted across a backplane test bus between a test master and a board under test.

BACKGROUND ART

Many electronics manufacturers routinely test circuit boards using the Boundary-Scan Test technique set forth in the IEEE 1149.1 Standard described in the IEEE publication *Test Access Port (TAP) and Boundary Scan Architecture* (hereinafter incorporated by reference). For Boundary-Scan Testing to occur, each circuit board must have a Boundary-Scan Test architecture. In particular, each board must possess at least one, and preferably, a plurality devices that each include one or more Boundary-Scan cells coupled in a serial chain for storing values associated with the operation of that device. In addition, each Boundary-Scan device must posses a Test Access Port (TAP) controller whose architecture is described in the above-described IEEE publication.

Each TAP controller manages the testing process for its associated device in accordance with a Test Mode Select (TMS) signal and Test Clock (TCK) signals provided from an external test system. At the outset of testing, each TAP controller shifts, via its Test Data Input (TDI) a swing of test bits into the chain of Boundary-Scan cells and then apply the string. When the circuit board is operating properly, the logic values latched in the Boundary-Scan cells assume prescribed values. If there are faults in the circuit board, then the logic values latched in one or more Boundary-Scan cells will differ from their corresponding prescribed values. To detect such differences, the external test system shifts out the bits from the Boundary-Scan cells for comparison to a set of pre-computed values for a fault-free board. Any differences between the shifted-out bits and the pre-computed values represent possible faults in the circuit board.

In the past, Boundary-Scan testing has required an individual test controller for managing the testing of an associated board. Presently, several manufacturers have developed slave modules for connecting individual circuit boards to a single system test controller (i.e., a test master) by way of a Boundary-Scan test bus that has separate TDI, TMS, TDO and TCK lines in accordance with the IEEE 1149.1 Standard. For this reason, the Boundary-Scan test bus will hereinafter be referred to as an 1149.1 backplane test bus. To accomplish Boundary-Sean testing in this manner, the test master first selects an individual board for testing by placing the address of that board on the 1149.1 backplane test bus. The board having the corresponding address responds to the test master, whereupon the test master supplies test information to, and receives test responses from, the corresponding board using the IEEE 1149.1 protocol.

The above-described networked approach to Boundary-Scan testing suffers from the disadvantage of possessing no mechanism for detecting transmission errors. In practice, the backplane test bus carrying signals from the test master to the individual boards may suffer from electrical noise that can cause errors in the transmitted information. Such transmission errors may not only adversely affect the test results, but may damage the one or more devices within the network Thus, there is a need for a technique for detecting transmission errors on the 1149.1 backplane test bus in a networked system.

BRIEF SUMMARY OF THE INVENTION

Briefly, in accordance with the invention, a method is provided for verifying the integrity of test information transmitted across an 1149.1 backplane test bus between a test master and at least one circuit board under test during at least one active interval. To verify the test information on the bus, the test master and the circuit board each generate a sender check code following the transmission of information across the 1149.1 backplane test bus by each one for receipt by the other. Additionally, both the test master and the circuit board also generate a receiver check code associated with the information received by each one from the other on the 1149.1 backplane test bus. The sender and receiver check codes are like parity codes because each is generated in accordance with the associated information passing on the 1149.1 backplane test bus and is used for error checking purposes. During an interval other than one of the active intervals when test information passes between the test master and the circuit board, the test master acquires the sender and receiver check codes generated by the circuit board. Thereafter, the test master compares the sender and receiver check codes acquired from the circuit board under test to the receiver and sender codes generated by the test master.

If no errors are present, the sender check code generated by the test master for a particular block of information transmitted thereby should match the receiver check code generated by the circuit board upon receipt of the information from the test master. Likewise, the receiver check code generated by the test master upon receipt of a block of information by the circuit board should match the sender code acquired from the circuit board under test. The degree to which the sender code and receiver codes does not match their corresponding receiver and sender codes, respectively, indicates the extent to which the transmitted and received information does not match.

Preferably, the above-described verification technique is practiced in connection with transmitting test information between the test master and each circuit board so that test information transmission is aborted if a transmission error is detected. By verifying the integrity of the 1149.1 backplane test bus in advance of further data transmission, errors in transmission that may damage the system will be avoided.

DETAILED DESCRIPTION

Figure 1:
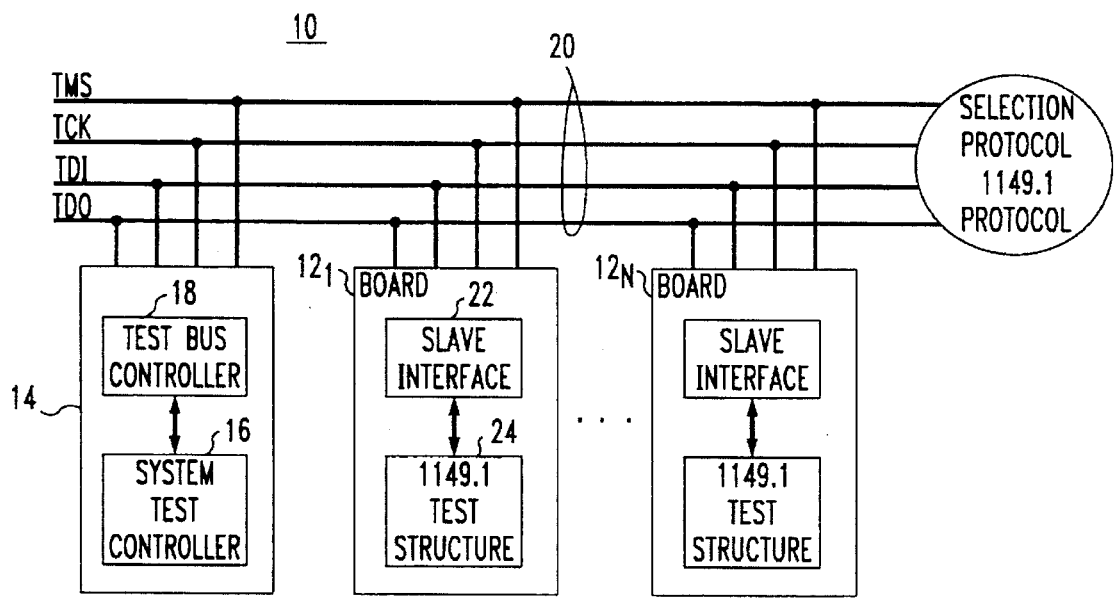
FIG. 1 illustrates a block schematic diagram of a test system having an 1149.1 backplane test bus in accordance with the prior art.

FIG. 1 depicts a prior art Boundary-Scan test network 10 comprised of a least one, and preferably, a plurality of circuit boards $12_1$–$12_n$ (where n is an integer) that are successively tested by a test master 14 using the Boundary-Scan technique described in the IEEE publication *Test Access Port (TAP) and Boundary Scan Architecture* (hereinafter incorporated by reference). The test master 14 includes a system test controller 16, typically a microprocessor and associated memory, for transmitting test information to each board and for collecting test responses therefrom. The test master 14 also includes a test bus controller 18 that formats the test information generated by, and the test responses supplied to, the system test controller 16 in accordance With the Boundary-Scan protocol specified in the IEEE 1149.1 Standard. In practice, the test bus controller 18 comprises a Boundary-Scan Master controller integrated circuit available from AT&T Microelectronics, Berkeley Heights, New Jersey. Other types of Boundary-Scan controllers manufactured by other semiconductor manufacturers may also be used for this purpose.

An 1149.1 test bus 20, comprised of four separate TMS, TCK, TDI and TDO signal lines (and optionally, a test reset (TRST) line), couples the test bus controller 18 within the test master 14 to a slave interface 22 within each circuit board to allow test information to be communicated between each board and the test master. The slave interface 22 typically comprises a Texas Instruments Addressable Scan Port 25 (ASP) or a National Semiconductor SCAN bridge, each capable of interfacing a Boundary-Scan test structure 24 on the corresponding circuit board to the 1149.1 backplane test bus 20.

Each of the circuit boards $12_1$–$12_n$ comprising part of the network 10 undergoes Boundary-Scan testing in the following manner. At the outset of testing, the system test controller 16 selects a desired one of the circuit boards $12_1$–$12_n$ for testing by generating an address unique to the selected board. The test bus controller 18 formats the address into a communication protocol and then places the formatted address on the 1149.1 backplane test bus 20. The slave interface 22 associated with each of the circuit boards $12_1$–$12_n$ receives the address. However, only slave interface 22 containing the correct address will respond. Once the selected one of the circuit boards $12_1$–$12_n$ has responded, then the test master 14 commences Boundary-Scan testing of the selected board. To that end, the test master 14 supplies test data and instructions ("test information") to the selected circuit board via the TDI line of the 1149.1 backplane test bus 20. In addition, the test master 14 receives responses from the selected circuit board via the TDO line of the 1149.1 backplane test bus 20.

As the test information passes between the test master 14 and the selected one of the circuit boards $12_1$–$12_n$, some of the information may become corrupted for various reasons. Such corrupted information may not only adversely affect the accuracy of the test but may also damage one or more elements in the network 10.

Figure 2:
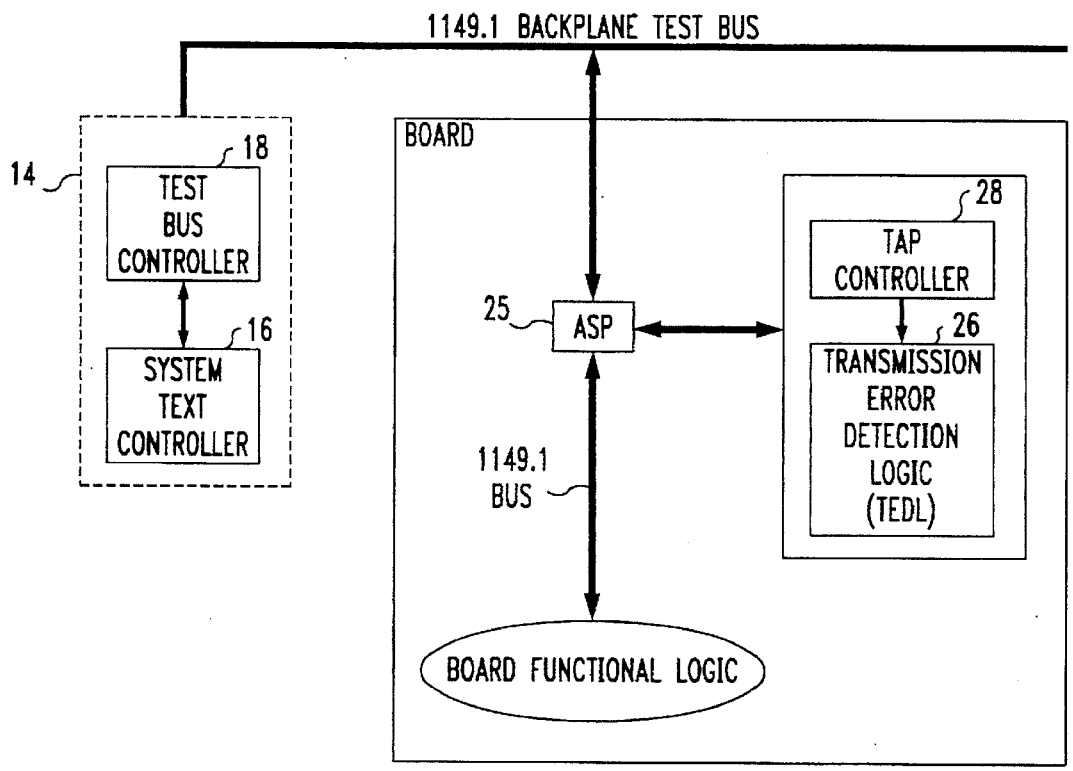
FIG. 2 shown the system of FIG. 1 modified in accordance with the invention.

FIG. 2 shows a modification to the network 10 in accordance with the invention for verifying test information passing on the 1149.1 backplane test bus 20. To accomplish test information verification in accordance with the invention, each of the circuit boards $12_1$–$12_n$ is provided with a Transmission Error Detection Logic (TEDL) 26 that is controlled by a TAP controller 28 configured in the manner described in the above-referenced IEEE publication. The TEDL 26, whose details will be discussed hereinafter with respect to FIG. 6, generates a check code for each block of test information received by the associated one of the circuit boards $12_1$–$12_n$. Additionally, the TEDL 26 on each board also generates a check code for each block of information (i.e., test responses) transmitted from the circuit board to the test master 14 across the 1149.1 backplane test bus 20. A mechanism (not shown) similar to the TEDL 26 is resident within the test master 14 for generating a check code for each block of information transmitted from, and each block of information received by, the test master.

Each check code is used for error checking purposes and may be obtained by computing the parity associated with a corresponding block of information. Rather than establish each check code by computing the parity for each associated block of information, a better approach would be to establish the check code by computing a cyclic redundancy check or a check sum on the associated block of information. Other types of error checking schemes could be employed to establish each check code. For ease of discussion, the check code generated by the test master 14 and by the TEDL 26 following the transmission of a block of information by each device across the 1149.1 backplane test bus 20 to the other device will be referred to as a "sender check code". Conversely, the check code generated by the test master 14 and the TEDL 26 of each board upon receipt of a block of test information by transmitted by the other will be referred to as a "receiver check-code".

Figure 3:
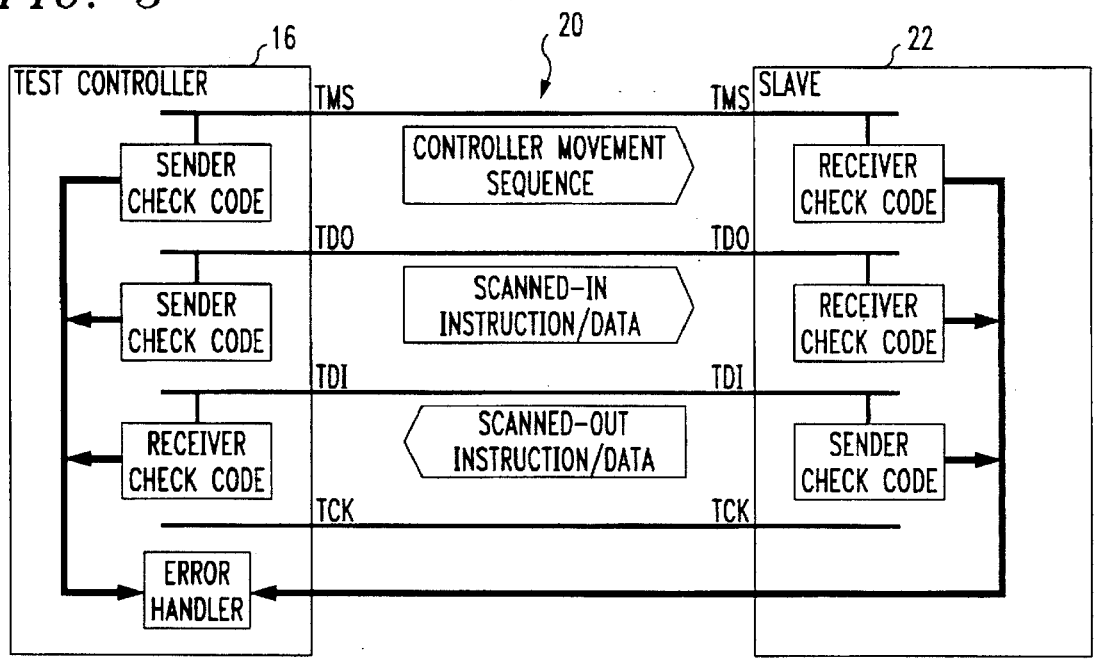
FIG. 3 is a simplified illustration of the system of FIG. 2 depicting the manner in which test information and check codes pass between elements in the system.

An example of the foregoing process of generating check codes is shown in FIG. 3. During testing, the test master 14 generates in stream test data or a test instruction at its TDO for receipt across the 1149.1 backplane test bus 20 by the corresponding slave 22. Thereafter, the test master 14 generates a sender check code corresponding the test information (data/instruction) just sent. Upon receipt of this tests information, the TEDL (not shown) associated with the slave 22 receiving the signal now generates a receiver check code in the same manner as the sender check code was generated. If the test information received at the slave 22 corresponds to the originally-transmitted test information, then the receiver check code should match the sender check code. Any difference between the transmitted and received test data will give rise to a difference between the sender and receiver check codes.

Following receipt of the test information from the test master 14, the slave 22 will scan out test information for receipt by the test master 14. Upon transmission of the scanned-out test information, the slave 22 will compute a sender check code for the transmitted data in exactly the same fashion that the test master computed its sender check code. After the test master 14 has received the scanned-out test information, the test master computes a receiver check code for the received information in exactly the same manner as the slave 22. Any difference between the sender check code generated by the slave 22 and the receiver check code generated by the test master 14 signifies an error in data transmission.

As may be appreciated from FIG. 3, the test master 14 typically transmits a TMS signal ,to the slave 22 in advance of transmitting test information. While the integrity of the TMS signal sent from the test master 14 can be verified by computing the sender and receiver check codes associated therewith, there are some complexities that must be addressed as compared to the above-described verification scheme for verifying test data and/or instructions.

To detect a transmission error, the test master 14 compares the sender and receiver check codes to detect any differences between them. Thus, the test master 14 must acquire the receiver and sender check codes generated by the TEDL 26 at each of the circuit boards $12_1$–$12_n$. To avoid the need for separate lines within the 1149.1 backplane test bus 20 of FIGS. 1 and 2 to transmit the sender and receiver check codes from each circuit board to the test master 14, the TDO line in 1149.1 backplane test bus 20 is used for this purpose. To minimize the impact on conventional Boundary-Scan testing, the check codes are advantageously communicated from each board to the test master 14 during a stable state of the Boundary-Scan test process. The Boundary-Scan test technique embodied in the IEEE 1149.1 standard and described in the IEEE publication *Test Access Port (TAP) and Boundary Scan Architecture* has four states during which no test instructions or data pass under control of the test system controller 18 between any of the circuit boards $12_1$–$12_n$ and the test master 14, both of FIG. 1. The four stable states are the Pause-Data Register (DR), Pause-Instruction Register (IR) Run-Test/Idle and Test-Logic Reset states. It is during one of these four states that the test master 14 of FIGS. 1 and 2 acquires check codes from each circuit board.

Figure 4:
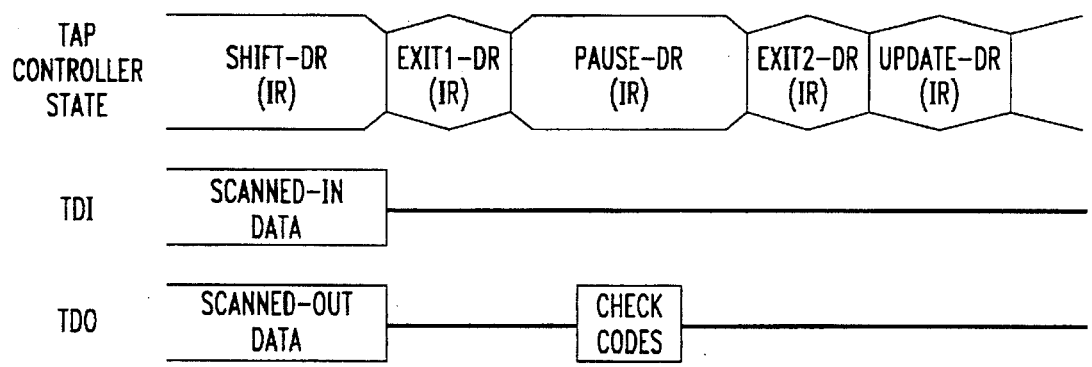
FIG. 4 is timing diagram illustrating a first method of operating the system of FIG. 2.

To better understand the manner in which check codes are communicated, reference should be made to FIG. 4 which shows a partial timing diagram indicating the state sequence associated with Boundary-Scan testing. Upon entry into the Shift-DR and the Shift-IR states, the circuit board receives test information and transmits test information, respectively. Any attempt to transmit non-test information to the circuit or to shift out test information during these intervals would interfere with testing of the circuit board.

Once the Shift-DR state (or the Shift-IR state) ends, the Pause-IR (or Pause-DR) state begins. It is during one of the Pause-IR or Pause-DR states (or during the Run-Test/Idle or the Test-Logic-Reset states) that sender check codes travel through the bus to avoid any interference with the normal Boundary-Scan testing process. In some instances, it may be desirable to compare every sender check code to its corresponding receiver check code for each block of data. To that end, both the test master 14 and the TEDL 26 of FIG. 2 may be configured in the manner discussed below with respect to FIG. 6 so the check codes travel through the 1149.1 backplane test bus 20 at specific intervals as depicted in FIG. 4. Only after each received check code matches the corresponding sender check code generated by the test master 14 does the test master transmit the next block of test information.

Figure 5:
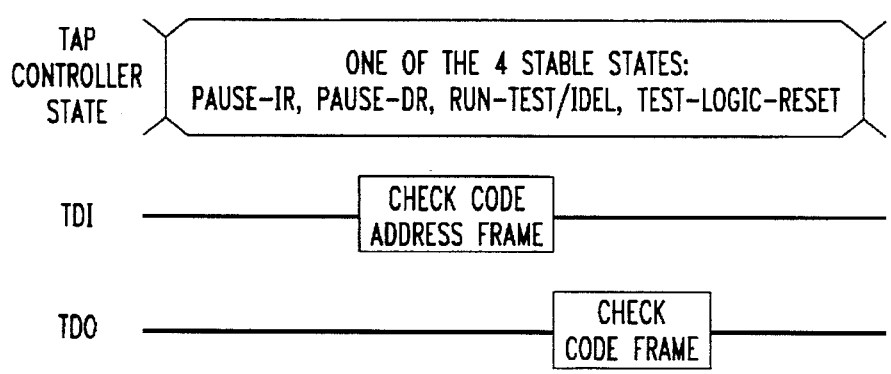
FIG. 5 is timing diagram illustrating another method of operating the system of FIG.. 2.

To reduce the overhead associated with test information verification, it may be desirable to send check codes from each circuit board only upon request by the test master 14. Referring now to FIG. 5, under such a scheme, the test master 14 of FIG. 1 transmits the address of a desired check code on the 1149.1 backplane test bus 20 of FIG. 1 at the beginning of one of the four stable Boundary-Scan states during an interval hereinafter referred to as a "check code address frame". Following the check code address frame, the selected one of the circuit boards $12_1$–$12_n$ would respond during the next frame with the corresponding check code.

Figure 6:
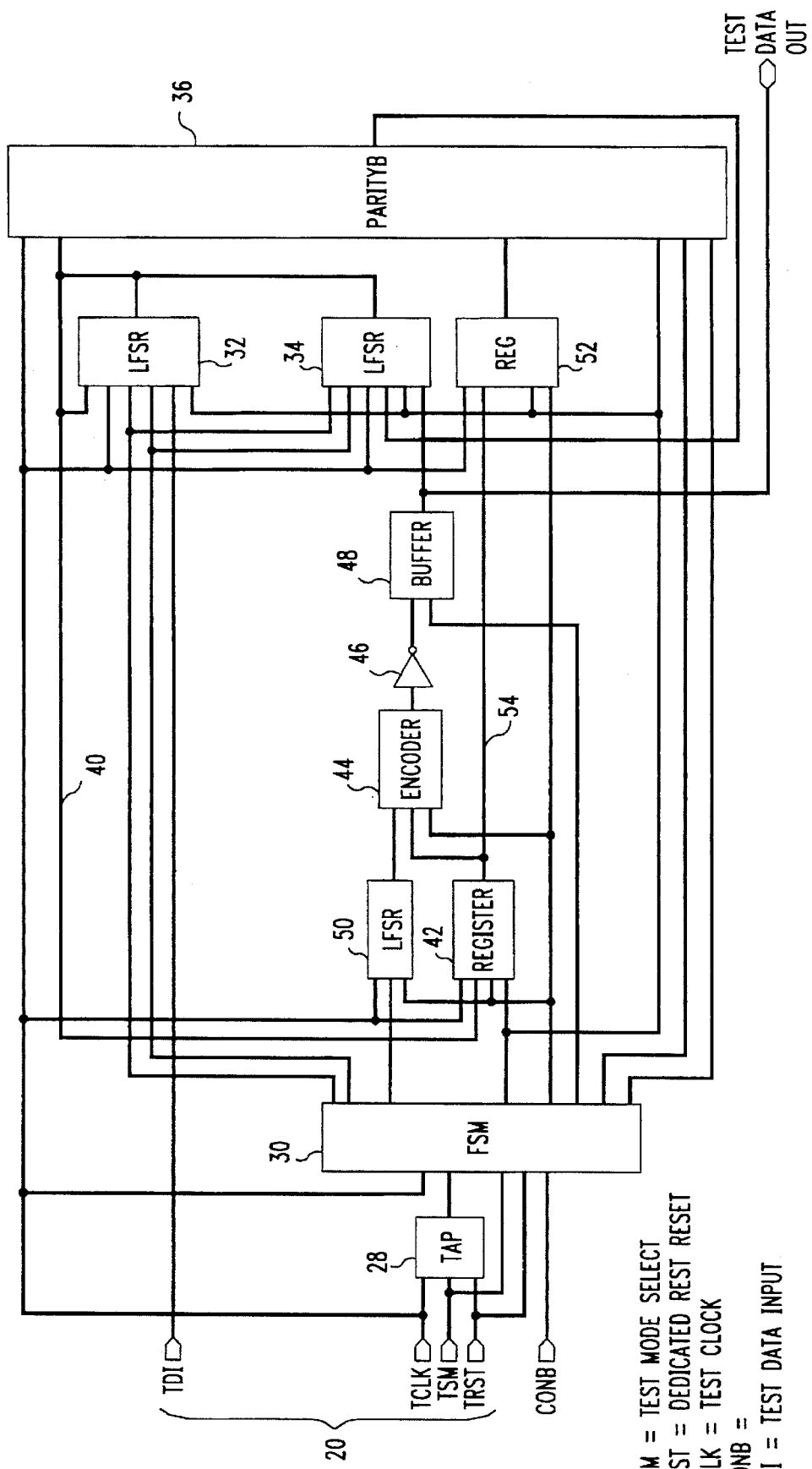
FIG. 6 shows a block schematic diagram of a first preferred embodiment of a Transmission Error Detection Logic (TEDL) incorporated within the system of FIG. 2.

Referring now to FIG. 6, there is shown a block schematic diagram of the TEDL 26 discussed briefly with respect to FIG. 2. The TEDL 26 of FIG. 6 is shown with the TAP controller 28 that is coupled to the TDI, TDO, TCK and TMS lines of the 1149.1 backplane test bus 20 and receives signals therefrom. The TAP controller 28 generates a control bit that controls the operation of a Finite State Machine (FSM) 30 associated with the TEDL 26. The FSM machine 30 monitors or traces the various states of the Boundary-Scan testing process by monitoring the signals on the 1149.1 bus 20 and by generating a set of command signals that vary accordingly for control purposes. The input terminals to the TAP controller 28 and/or the FSM 30 include a test clock (tclk, a test mode select (tms), a dedicated test-reset (trst) and a control bit (conb).

Among the elements that are controlled by the command signals from the FSM 30 are a pair of Linear Feedback Shift Registers (LFSRs) 32 and 34. The LFSRs 32 and 34 calculate check sums for information transmitted from, and received by, respectively, the slave 22 of FIG. 2 that incorporates the TEDL 26 of FIG. 6. A parity calculation circuit 36 is coupled to the LFSRs 32 and 34 for performing a parity calculation on the check sum established by each of the LFSRs.

Each of the LFSRs 32 and 34, together with the parity generator 36, are coupled via a bus 40 to a first register 42 which stores a frame header. The register 42 is coupled to an encoder 44 which encodes the frame header stored in the register as well as the check codes computed by the LFSRs 32 and 34 and the parity bit generated by the parity generator 36. The encoded information is inverted by an inverter 46 and buffered by a buffer 48 before being output on the TDO line of the 1149.1 backplane test bus 20 for receipt by the test master 14 of FIG. 1. The information supplied to the test master 14 is encoded so that the test master can identify the beginning and end of the information.

The encoder 44 is responsive to the count of a counter 50, typically comprised of a Linear Feedback Shift Register. The counter 50 counts the number of bits of the check sums supplied from the LFSRs 32 and 34 and the parity bit from the parity generator 36. After the counter 50 has counted the appropriate number of bits following transmission of the frame header, the counter signals a second register 52 to supply a frame trailer stored in that register to the encoder 44 for encoding along a bus 54.

In operation, the FSM 30 monitors the state of Boundary-Scan testing to determine when each of PAUSE-IR and PAUSE-DR states is reached. Upon entry of the Boundary-Scan testing process each of the PAUSE-IR and PAUSE-DR states, the FSM 30 provides the appropriate control signals to the register 42, the LFSRs 32 and 34, and the parity bit generator 36. In this way, test master 14 of FIG. 1 receives the frame header, the sender and receiver check codes and the associated parity bits. While the check sum and parity bits are transmitted, the counter 50 counts the number of these bits. Once the counter 50 has counted to a prescribed count corresponding to the number of bits in the sender and receiver check and associated parity bit, then the register is signaled to provide the frame trailer for transmission after the sender and receiver check codes and associated parity bits.

As described, the FSM 30 of the TEDL 26 of FIG. 6 monitors the state of the Boundary-Scan testing so that the TEDL transmits the sender and receiver check codes and associated parity bits during each of the PAUSE-IR and PAUSE-DR states. As discussed previously with respect to FIG. 4, it may be desirable to transmit the check codes only upon request. Under such circumstances, the FSM 30 would be modified accordingly so as to respond not only to a stable state of the Boundary-Scan process, but to a specific request to transmit the check code.

It is to be understood that the above-described embodiments are merely illustrative of the principles of the invention. Various modifications and changes may be made thereto by those skilled in the art which will embody the principles of the invention and fall within the spirit and scope thereof.

What is claimed is:

1. A method for verifying test information transmitting between a master controller and at least one circuit board across a Boundary-Scan test bus during at least one active interval, comprising the steps of:

generating, at said master controller and said one circuit board, a sender check code associated with test information generated thereby and a receiver check code associated with test information received thereby;

acquiring, by the master controller, during at least one interval other than said one active interval, the sender and receiver check codes generated by said one circuit board; and comparing, at the master controller, the sender and receiver check codes generated by the master controller for test information transmitted to, and received from, said one circuit board, to the receiver and sender check codes, respectively, acquired from said one circuit board for test information received from and sent to, respectively, the master controller to verify whether any errors are present.

2. The method according to claim 1 further including the step of aborting a transmission of test information across the Boundary-Scan test bus before an application of the information if an error is detected.

3. The method according to claim 1 wherein the generating step includes the step of generating each sender check code associated with said test information by computing a check sum for said test information.

4. The method according to claim 1 wherein the generating step includes the step of generating each sender check code associated with said test information by computing both a check sum and a parity for said test information.

5. The method according to claim 1 wherein the generating step includes the step of generating each receiver check code associated with said test information by computing a check sum for said test information.

6. The method according to claim 1 wherein the generating step includes the step of generating each receiver check code associated with said test information by computing both a check sum and a parity for said test information.

7. The method according to claim 1 wherein the acquiring step includes the step of acquiring automatically the sender and receiver check codes by the master controller.

8. The method according to claim 1 wherein the acquiring step includes the step of acquiring only upon request the sender and receiver check codes by the master controller.

9. The method according to claim 1 wherein said step of generating includes encoding each sender check code and each receiver check.

10. For use with a system with a Boundary-Scan bus, and including a test master and at least one circuit board under test coupled to the test master by way of said Boundary-Scan bus that transmits test information between the test master and the circuit board under test, apparatus carried by each circuit board for facilitating detection of transmission errors, comprising:

means for computing a receiver check code in accordance with information received by the circuit board;

means for generating a sender check code in accordance with information transmitted by the circuit board;

means, coupled to each of said receiver check code computing means and said sender check code generating means, for generating a parity bit associated with each of the receiver check code and sender check code;

means, coupled to each of said receiver check code computing means and said sender check code generating means and said parity generating means, for generating a frame header for concatenation with, and upstream of, the receiver and sender check codes and the parity bits associated therewith;

means, coupled to each of said receiver check code computing means, said sender check code generating means and said parity generating means, for counting the receiver and sender check codes and the parity bits associated therewith;

means responsive to the counting means for generating a frame trailer for concatenation with, and upstream of, the receiver and sender check codes and the parity bits associated therewith; and means for encoding the frame header, the receiver and sender check codes and the parity bits associated therewith, and the frame trailer for transmission to the test master.

11. The apparatus according to claim 10 wherein each of said means for generating the receiver check code and the sender check code comprises a linear feedback shift register.

12. The apparatus according to claim 10 wherein each of said means for generating the frame header and the frame trailer comprises a register.

* * * * *